United States Patent
Shin et al.

(10) Patent No.: US 9,331,044 B2
(45) Date of Patent: May 3, 2016

(54) SEMICONDUCTOR DEVICE CONNECTED BY ANISOTROPIC CONDUCTIVE FILM

(71) Applicant: SAMSUNG SDI CO., LTD., Yongin-si, Gyeonggi-do (KR)

(72) Inventors: Young Ju Shin, Suwon-si (KR); Kyoung Ku Kang, Suwon-si (KR); Ji Yeon Kim, Suwon-si (KR); Kyoung Soo Park, Suwon-si (KR); Woo Jung Shin, Suwon-si (KR); Kwang Jin Jung, Suwon-si (KR); Ja Young Hwang, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 14/500,064

(22) Filed: Sep. 29, 2014

(65) Prior Publication Data

US 2015/0091192 A1   Apr. 2, 2015

(30) Foreign Application Priority Data

Sep. 30, 2013   (KR) ........................ 10-2013-0116391

(51) Int. Cl.
*H01L 23/48*   (2006.01)
*H01L 23/52*   (2006.01)
(Continued)

(52) U.S. Cl.
CPC ................ *H01L 24/29* (2013.01); *H01L 24/27* (2013.01); *H01L 24/83* (2013.01); *H05K 3/323* (2013.01);
(Continued)

(58) Field of Classification Search
CPC ................ H01L 2924/00014; H01L 2224/29; H01L 2224/29013; H01L 2224/2908; H01L 24/27; H01L 24/92; H01L 24/29; H01L 24/83; H01L 2224/29083
USPC .......... 257/E21.514, E21.503, 746, 750, 772, 257/775, 778, 779, 786, 788; 438/106, 108, 438/119, 120, 125, 613
See application file for complete search history.

(56) References Cited

U.S. PATENT DOCUMENTS

2002/0071087 A1* 6/2002 Suzuki ................. G02F 1/1345
                                                        349/155
2006/0033213 A1* 2/2006 Yim ........................ H01L 24/29
                                                        257/753

(Continued)

FOREIGN PATENT DOCUMENTS

JP          2000-178511 A    6/2000
KR    10-2012-0036721 A      4/2012

(Continued)

OTHER PUBLICATIONS

Taiwanese Office Action for 103133945 dated Jul. 21, 2015; Shin, et al.

(Continued)

*Primary Examiner* — Thao X Le
*Assistant Examiner* — Nduka Ojeh
(74) *Attorney, Agent, or Firm* — Lee & Morse, P.C.

(57) ABSTRACT

A semiconductor device connected by an anisotropic conductive film including a first insulation layer, a conductive layer, and a second insulation layer one above another, wherein the conductive layer has an expansion length of 20% or less in a width direction thereof, and the second insulation layer has an expansion length of 50% or more in a width direction thereof, the expansion length is calculated according to Equation 1, below, after glass substrates are placed on upper and lower sides of the anisotropic conductive film respectively, followed by compression at 110° C. to 200° C. for 3 to 7 seconds under a load of 1 MPa to 7 MPa per unit area of a sample, Increased ratio of expansion length (%)=[(length of corresponding layer in width direction after compression−length of corresponding layer in width direction before compression)/length of corresponding layer in width direction before compression]×100.   [Equation 1]

9 Claims, 1 Drawing Sheet

(51) Int. Cl.
*H01L 29/40* (2006.01)
*H01L 23/00* (2006.01)
*H05K 3/32* (2006.01)

(52) U.S. Cl.
CPC .......... *H01L 24/32* (2013.01); *H01L 2224/271* (2013.01); *H01L 2224/27003* (2013.01); *H01L 2224/2712* (2013.01); *H01L 2224/293* (2013.01); *H01L 2224/29005* (2013.01); *H01L 2224/2929* (2013.01); *H01L 2224/2939* (2013.01); *H01L 2224/29083* (2013.01); *H01L 2224/29339* (2013.01); *H01L 2224/29344* (2013.01); *H01L 2224/29347* (2013.01); *H01L 2224/29355* (2013.01); *H01L 2224/29387* (2013.01); *H01L 2224/29393* (2013.01); *H01L 2224/29439* (2013.01); *H01L 2224/29444* (2013.01); *H01L 2224/29455* (2013.01); *H01L 2224/32145* (2013.01); *H01L 2224/32227* (2013.01); *H01L 2224/83203* (2013.01); *H01L 2224/83851* (2013.01); *H01L 2924/0665* (2013.01); *H01L 2924/15788* (2013.01); *H01L 2924/2064* (2013.01); *H01L 2924/20104* (2013.01); *H01L 2924/20105* (2013.01); *H01L 2924/20641* (2013.01); *H01L 2924/30101* (2013.01)

(56) References Cited

U.S. PATENT DOCUMENTS

| 2013/0123691 | A1 | 5/2013 | Schultz |
| 2013/0196129 | A1* | 8/2013 | Lee ............. B32B 7/12 428/212 |
| 2013/0213691 | A1* | 8/2013 | Park ............ H01B 3/082 174/126.4 |

FOREIGN PATENT DOCUMENTS

| KR | 10-2012-0076187 A | 7/2012 | |
| TW | 201226518 A | 7/2012 | |
| WO | WO 2012091237 A1 * | 7/2012 | ............. 428/212 |

OTHER PUBLICATIONS

Korean Office Action dated Nov. 12, 2015.

* cited by examiner

SEMICONDUCTOR DEVICE CONNECTED BY ANISOTROPIC CONDUCTIVE FILM

CROSS-REFERENCE TO RELATED APPLICATION

Korean Patent Application No. 10-2013-0116391, filed on Sep. 30, 2013, in the Korean Intellectual Property Office, and entitled: "Semiconductor Device Connected by Anisotropic Conductive Film," is incorporated by reference herein in its entirety.

BACKGROUND

1. Field

Embodiments relate to a semiconductor device connected by an anisotropic conductive film.

2. Description of the Related Art

Generally, anisotropic conductive films (ACFs) refer to film-shaped adhesives prepared by dispersing conductive particles in a resin such as an epoxy resin. An anisotropic conductive film is a polymer layer having electric anisotropy and adhesiveness, and exhibits conductive properties in the thickness direction of the film and insulating properties in the surface direction thereof.

When an anisotropic conductive film is placed between circuit boards and is subjected to heating and compression under certain conditions, circuit terminals of the circuit boards may be electrically connected to each other through conductive particles, and an insulating layer fills spaces between adjacent circuit terminals to isolate the conductive particles from each other, thereby providing high insulation between the circuit terminals.

SUMMARY

Embodiments are directed to a semiconductor device connected by an anisotropic conductive film.

The embodiments may be realized by providing a semiconductor device connected by an anisotropic conductive film, the anisotropic conductive film including a first insulation layer, a conductive layer, and a second insulation layer sequentially stacked one above another, wherein the conductive layer has an increased ratio of expansion length of 20% or less in a width direction thereof, and the second insulation layer has an increased ratio of expansion length of 50% or more in the width direction thereof, the expansion length is calculated according to Equation 1, below, after glass substrates are placed on upper and lower sides of the anisotropic conductive film respectively, followed by compression at 110° C. to 200° C. for 3 to 7 seconds under a load of 1 MPa to 7 MPa per unit area of a sample, Increased ratio of Expansion length (%)=[(length of layer in width direction after compression−length of layer in width direction before compression)/length of layer in width direction before compression]×100. [Equation 1]

A ratio of the expansion length of the second insulation layer to the expansion length of the conductive layer may range from 3 to 50.

The anisotropic conductive film may have a particle capture rate of 30% to 60%, as measured after the anisotropic conductive film is placed a glass comprising a first electrode and COF, Driver-IC or IC chip comprising a second electrode, followed by primary compression under conditions of 110° C. to 190° C. for 1 to 7 seconds under a load of 50 MPa to 90 MPa, and calculated by Equation 2:

Particle capture rate=(the number of conductive particles per unit area (mm$^2$) of connected portion after primary compression/the number of conductive particles per unit area (mm$^2$) of anisotropic conductive film before pre-compression)×100. [Equation 2]

The anisotropic conductive film may have an connection resistance of 4Ω or less, as measured after the anisotropic conductive film is placed a glass comprising a first electrode and COF, Driver-IC or IC chip comprising a second electrode, followed by primary compression under conditions of 110° C. to 190° C. for 1 to 7 seconds under a load of 50 MPa to 90 MPa.

The anisotropic conductive film may have a connection resistance after reliability testing of 10Ω or less, as measured after the anisotropic conductive film is placed a glass comprising a first electrode and COF, Driver-IC or IC chip comprising a second electrode, followed by primary compression under conditions of 110° C. to 190° C. for 1 to 7 seconds under a load of 50 MPa to 90 MPa, and left at 85° C. and 85% RH for 500 hours.

The first insulation layer may have a thickness of 2 μm or less, the conductive layer may have a thickness of 2 μm to 10 μm and the second insulation layer may have a thickness of 6 μm to 18 μm.

The conductive layer may include 10 wt % to 40 wt % of inorganic particles, based on a total weight of the conductive layer in terms of solid content.

The inorganic particles may have an average particle size of 5 nm to 20 nm.

The conductive layer may include 20 wt % to 50 wt % of a binder resin; 5 wt % to 20 wt % of an epoxy resin; 0.5 wt % to 10 wt % of a curing agent; 10 wt % to 40 wt % of inorganic particles; and 10 wt % to 40 wt % of conductive particles, all wt % being based on a total weight of the conductive layer in terms of solid content.

The second insulation layer may include a binder resin and an epoxy resin in a weight ratio of 1:1 to 1:8.

The second insulation layer may include 15 wt % to 50 wt % of a binder resin; and 40 wt % to 75 wt % of an epoxy resin, all wt % being based on a total weight of the second insulation layer in terms of solid content.

The first insulation layer may include 20 wt % to 60 wt % of a binder resin; 40 wt % to 80 wt % of an epoxy resin; and 0.1 wt % to 10 wt % of a curing agent, all wt % being based on a total weight of the first insulation layer in terms of solid content.

The embodiments may be realized by providing a semiconductor device connected by an anisotropic conductive film, the anisotropic conductive film including a first insulation layer, a conductive layer, and a second insulation layer sequentially stacked one above another, wherein a ratio of an expansion length of the second insulation layer to an expansion length of the conductive layer ranges from 3 to 50, as measured after glass substrates may be placed on upper and lower sides of the anisotropic conductive film respectively, followed by compression at 110° C. to 200° C. for 3 to 7 seconds under a load of 1 to 7 MPa per unit area of a sample, the expansion lengths being calculated according to Equation 1, below, Increased ratio of expansion length (%)=[(length of layer in width direction after compression−length of layer in width direction before compression)/length of layer in width direction before compression]×100. [Equation 1]

After compression the conductive layer may have an increased ratio of expansion length of 20% or less in a width direction thereof, and the second insulation layer may have an increased ratio of expansion length of 50% or more in the width direction thereof, as calculated by Equation 1.

The first insulation layer may have a thickness of 2 μm or less, the conductive layer may have a thickness of 2 μm to 10 μm, and the second insulation layer may have a thickness of 6 μm to 18 μm.

The conductive layer may include 10 wt % to 40 wt % of inorganic particles, based on a total weight of the conductive layer in terms of solid content.

The inorganic particles may have an average particle size of 5 nm to 20 nm.

The conductive layer may include 20 wt % to 50 wt % of a binder resin; 5 wt % to 20 wt % of an epoxy resin; 0.5 wt % to 10 wt % of a curing agent; 10 wt % to 40 wt % of inorganic particles; and 10 wt % to 40 wt % of conductive particles, all wt % being based on a total weight of the conductive layer in terms of solid content.

The second insulation layer may include 15 wt % to 50 wt % of a binder resin; and 40 wt % to 75 wt % of an epoxy resin, all wt % being based on a total weight of the second insulation layer in terms of solid content.

The first insulation layer may include 20 wt % to 60 wt % of a binder resin; 40 wt % to 80 wt % of an epoxy resin; and 0.1 wt % to 10 wt % of a curing agent, all wt % being based on a total weight of the first insulation layer in terms of solid content.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
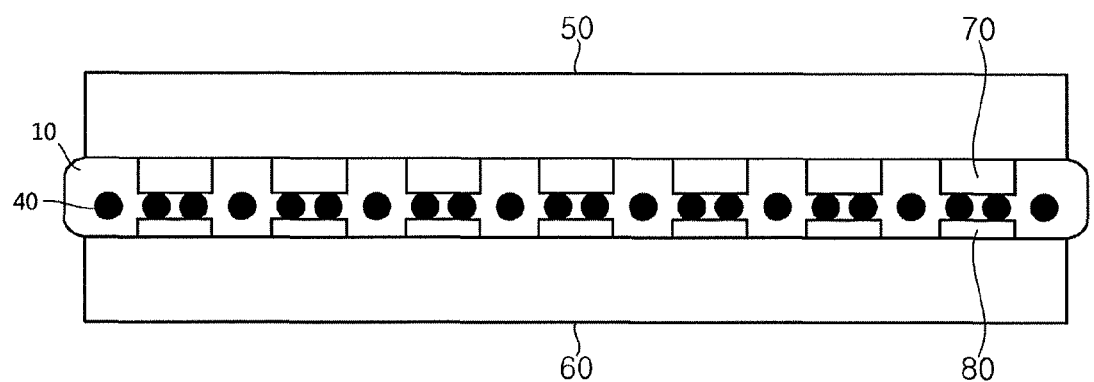
FIG. 1 illustrates a sectional view of a semiconductor device connected by an anisotropic conductive film according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

First, referring to FIGS. 1 and 2, a semiconductor device including an anisotropic conductive film according to an embodiment will be described.

Referring to FIG. 1, a semiconductor device connected by an anisotropic conductive film according to an embodiment may include a first connecting member 50 having a first electrode 70; a second connecting member 60 having a second electrode 80; and an anisotropic conductive film 10 between the first connecting member 50 and the second connecting member 60. The anisotropic conductive film 10 may include conductive particles 40 through which the first electrode 70 is electrically connected to the second electrode 80.

For example, in the semiconductor device connected by an anisotropic conductive film according to an embodiment, when the anisotropic conductive film 10 is placed and compressed between the first connecting member 50 having the first electrode 70 and the second connecting member 60 having the second electrode 80, the first electrode 70 and the second electrode 80 may be connected to each other via the conductive particles 40.

In an implementation, the first and second connecting members may have similar structures in terms of material, thickness, size, and interconnectivity. In an implementation, the first and second connecting members may have a thickness of about 20 pan to about 100 μm.

In an implementation, the first and second connecting members may have different structures and functions in terms of material, thickness, size, and interconnectivity.

The first connecting member 50 or the second connecting member 60 may be formed of, e.g., Driver-IC, IC chip, glass, PCB (Printed Circuit Board), fPCB, COF, TCP, ITO glass, or the like. The first electrode 70 or the second electrode 80 may be a protruding electrode or a flat electrode. When the first and second electrodes are protruding electrodes, these electrodes may have a height (H) of about 2.50 μm to about 10 μm, a width (W) of about 50 μm to about 120 μm, and/or a gap (G) between electrodes of about 50 μm to about 110 μm.

For example, the electrodes may have a height (H) of about 2.50 μm to about 9 μm, a width (W) of about 50 μm to about 100 μm, and/or a gap (G) of about 60 μm to about 100 μm.

When the first and second electrodes are flat electrodes, the electrodes may have a thickness of about 500 Å to about 1,200 Å.

The first electrode 70 or the second electrode 80 may be formed of, e.g., ITO, copper, silicon, IZO, or the like.

For example, the flat electrodes may have a thickness of 800 Å to 1,200 Å, and/or the protruding electrodes may have a height of 6 μm to 10 μm. In this case, the insulating layer may have a thickness of 4 μm to 12 μm to exhibit sufficient adhesive strength. For example, the flat electrodes may have a thickness of 1,000 Å and/or the protruding electrodes may have a height of 8 μm. In this case, the insulating layer may have a thickness of 6 μm to 10 μm.

Figure 2:
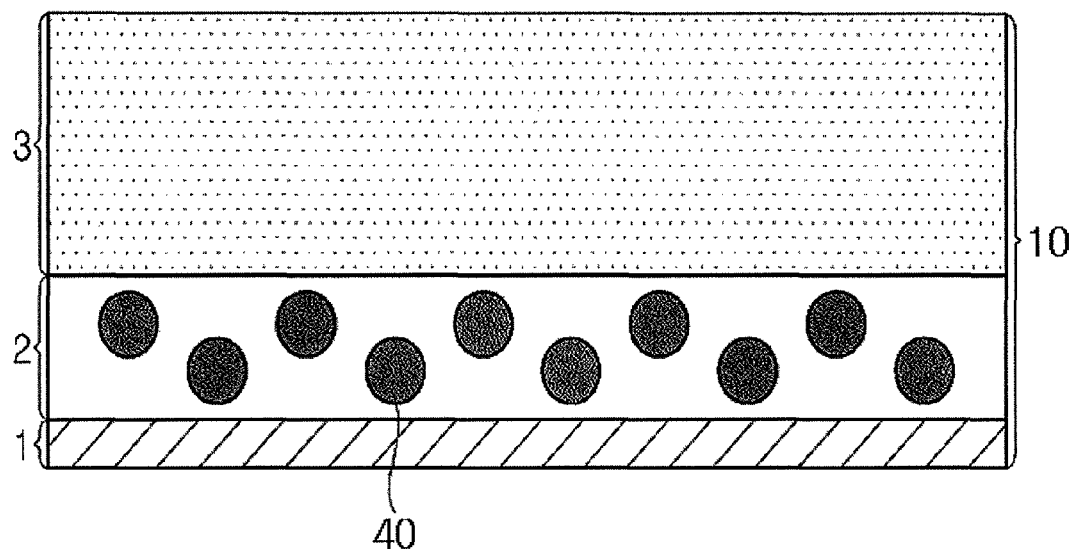
FIG. 2 illustrates a sectional view of the anisotropic conductive film included in the semiconductor device connected by an anisotropic conductive film according to an embodiment

FIG. 2 illustrates a sectional view of an anisotropic conductive film 10 having a triple layer structure in a semiconductor device connected by an anisotropic conductive film according to an embodiment.

The anisotropic conductive film 10 according to the present embodiment may include a conductive layer 2 containing conductive particles 40, a first insulation layer 1 stacked on one side of the conductive layer 2, and a second insulation layer 3 stacked on the other side of the conductive layer 2.

For example, the anisotropic conductive film 10 according to this embodiment may have a multilayer structure that includes the conductive layer 2 and the insulating layers 1, 3. In the anisotropic conductive film, the conductive layer 2 may include the conductive particles 40 for electrical connection, and the insulating layers 1, 3 (not including the conductive particles 40) may be formed on upper and lower sides of the conductive particles 40, respectively, thereby imparting insulating properties to the anisotropic conductive film 10 without obstructing compression of the conductive particles 40 in the process of compressing the anisotropic conductive film.

Herein, the term "stacked" means that a certain layer is formed on one side of another layer, and may be compatibly used together with other terms such as "coated" or "laminated".

If an anisotropic conductive film were to be formed in a typical bilayer structure, the conductive film may be formed to be hard in order to help reduce flowability of the conductive layer, thereby making it difficult to realize adhesive strength upon pre-compression, or the insulating layer may formed in a single layer structure, thereby making it difficult to achieve sufficient filling of the insulating layer between terminals. The anisotropic conductive film which has a first insulation layer according to an embodiment may overcome such issues associated with the bilayer structure.

In an implementation, the first insulation layer 1 may have a thickness of 2 μm or less and the conductive layer 2 may have a thickness of 2 μm to 10 μm. The second insulation layer 3 may have a thickness of 6 μm to 18 μm.

For example, the first insulation layer 1 may have a thickness of 1 μm or less; the conductive layer 2 may have a thickness of 2 μm to 8 μm; and the second insulation layer 3 may have a thickness of 8 μm to 16 μm.

When the first insulation layer 1 has a thickness of 2 μm or less, e.g., when the first insulation layer has a sufficiently thin thickness in the range of greater than 0 μm to 2 μm, the anisotropic conductive film may help further improve connection reliability through reduction of detachment, may facilitate pre-compression, and may help secure cohesion to the substrate.

In an implementation, the first insulation layer, the conductive layer, and the second insulation layer may be sequentially stacked in this order. The conductive layer may have an expansion length of 20% or less in a width direction thereof, and the second insulation layer may have expansion length of 50% or more in a width direction thereof. Here, the expansion length of each of the conductive layer and the second insulation layer may be measured, determined, or calculated after glass substrates may be placed on upper and lower sides of the anisotropic conductive film respectively, followed by compression at 110° C. to 200° C. (detection temperature of the anisotropic conductive film) for 3 to 7 seconds under a load of 1 MPa to 7 MPa (per unit area of a sample). The increased ratio of expansion length may be calculated according to Equation 1, below.

According to an embodiment, the second insulation layer 3 may be a conductive particle-free layer that contacts the first connecting member 50 or the first electrode 70.

The second insulation layer may be pre-compressed or compressed by a press adding temperature and pressure to the first connecting member 50.

When the second insulation layer has the increased ratio of expansion length of 50% or more, the conductive particles capture rate may increase without resulting in or causing an undesirable short-circuit.

For example, the conductive layer may have an increased ratio of expansion length of 0.1% to 20%, and the second insulation layer may have an increased ratio of expansion length of 50% to 200%. In an implementation, the conductive layer may have an increased ratio of expansion length of 1% to 20%, and the second insulation layer may have an increased ratio of expansion length of 50% to 100%.

Increased ratio of expansion length (%)=[(length of layer in width direction after compression−length of layer in width direction before compression)/length of layer in width direction before compression]×100.   [Equation 1]

In an implementation, a thickness of the second insulation layer may be thicker than that of the first insulation layer.

For example, the first insulation layer may have a thickness of 2 μm or less, and may not include conductive particles. The conductive layer may include conductive particles. The second insulation layer may have a thickness of 6 μm to 18 μm and may not comprise conductive particles.

In an implementation, compression may be performed at 140° C. to 160° C. for 4 to 6 seconds under a load of 1 MPa to 5 MPa.

When the anisotropic conductive film is compressed, the conductive particles on the terminals may be compressed, and heat and pressure applied to the conductive particles in the course of compression may cause flow of components in each layer, thereby providing differences in expansion of the layers according to flowability of each layer.

Thus, when compression is performed under the conditions according to this embodiment, the respective layers may exhibit different expansion lengths according to flowability thereof. The increased ratio of expansion length within the above ranges may mean that the conductive layer has very low flowability.

Within the above ranges, the insulation layer may have high flowability, thereby reducing outflow of the conductive particles and short-circuit caused thereby, while allowing a space between terminals to be sufficiently filled with the insulation layer so as to secure high insulating properties.

By way of example, the increased ratio of expansion length may be measured as follows. First, a sample anisotropic conductive film having a size of 2 mm×20 mm (width×length) may be prepared. Then, glass substrates may be placed on upper and lower sides of the anisotropic conductive film respectively, followed by compression at 150° C. (with reference to detection temperature of an anisotropic conductive film) for 5 seconds under a load of 3 MPa (per unit area of the sample). The length of each layer in the width direction thereof may be measured before compression and after compression. Then, the increase in length of each corresponding layer may be expressed as the increased ratio of expansion length according to Equation 1.

In the anisotropic conductive film according to an embodiment, the anisotropic conductive film comprising: a first insulation layer, a conductive layer, and a second insulation layer sequentially stacked one above another, wherein a ratio of an expansion length of the second insulation layer to an expansion length of the conductive layer ranges from 3 to 50, as measured after glass substrates may be placed on upper and lower sides of the anisotropic conductive film respectively, followed by compression at 110° C. to 200° C. for 3 to 7 seconds under a load of 1 to 7 MPa per unit area of a sample.

Specifically, the ratio of the expansion length of the second insulation layer to the expansion length of the conductive layer may range e.g., from 4 to 30 or from 4 to 20.

A higher ratio of the expansion length of the second insulation layer to the expansion length of the conductive layer (second insulation layer/conductive layer) may be indicative of a large difference in flowability between these layers, and lower flowability of the conductive layer and higher flowability of the second insulation layer may provide a higher ratio of the expansion length of the second insulation layer to the expansion length of the conductive layer.

As described above, the flowability of the conductive layer and the second insulation layer may be variably adjusted such that the conductive layer has low flowability, in consideration of the capture rate of conductive particles.

In an implementation, a thickness of the second insulation layer may be greater than that of the first insulation layer, e.g., the second insulation layer may be thicker than the first insulation layer.

In an implementation, the first insulation layer may have a thickness of 2 μm or less, and the second insulation layer may have a thickness of 6 μm to 18 μm.

In an implementation, a ratio of the expansion length of the second insulation layer to the expansion length of the conductive layer may range from 3 to 50.

Within the above ranges, the second insulation layer may have high flowability and may easily fill a space between circuit terminals, thereby securing sufficient conductivity and insulating properties of the anisotropic conductive film.

In addition, when cured within the above range, the anisotropic conductive film may help improve connection reliability.

In an implementation, the ratio of the expansion length of the second insulation layer to the expansion length of the conductive layer may be measured as follows. First, a sample anisotropic conductive film having a size of 2 mm×20 mm (width×length) may be prepared. Then, glass substrates may be placed on upper and lower sides of the anisotropic conductive film respectively, followed by compression at 150° C. (with reference to detection temperature of an anisotropic conductive film) for 5 seconds under a load of 3 MPa (per unit area of the sample). Then, a widthwise length of each layer may be measured after compression under these conditions to calculate the ratio of the expansion length of the second insulation layer to the expansion length of the conductive layer.

The anisotropic conductive film according to the present embodiment may facilitate capture of the conductive particles. In an implementation, the anisotropic conductive film may have a particle capture rate of 30% to 60%, e.g., 40% to 60%, as calculated by the following equation 2, based on measurement results after the anisotropic conductive film may be placed a glass comprising a first electrode and COF, Driver-IC or IC chip comprising a second electrode, followed by primary compression under conditions of 110° C. to 190° C. for 1 to 7 seconds under a load of 50 MPa to 90 MPa.

Particle capture rate=(the number of conductive particles per unit area (mm$^2$) of connected portion after primary compression/the number of conductive particles per unit area (mm$^2$) of anisotropic conductive film before pre-compression)×100   [Equation 2]

Within this range, a sufficient amount of the conductive particles may be placed on the terminals to help reduce outflow of the conductive particles into a space, thereby improving electrical conductivity while helping to prevent an undesirable short circuit between the terminals.

As used herein, the particle capture rate is a percent value of the number of conductive particles placed on the terminals before and after primary compression and may be measured, e.g., as follows: the number of conductive particles (the number of particles before compression) placed on the terminals before pre-compression and the number of conductive particles (the number of particles after compression) placed on the terminals after primary compression under conditions of 150° C., 70 MPa, and 5 seconds are measured using a metallurgical microscope, followed by calculating the particle capture rate according to Equation 2.

For example, pre-compression may be performed at 50° C. to 90° C. for 1 to 5 seconds under a load of 1.0 MPa to 5.0 MPa. Not only the particle capture rate but also other physical properties of anisotropic conductive films (e.g., prepared in the Examples and Comparative Examples described below) may be measured after pre-compression under these conditions and primary compression under conditions of 110° C. to 190° C. for 1 to 7 seconds under a load of 50 MPa to 90 MPa.

For example, the pre-compression may be performed under conditions of 60° C. to 80° C. for 1 to 3 seconds under a load of 1.0 MPa to 3.0 MPa.

The primary compression may be performed under conditions of 120° C. to 180° C. for 3 to 7 seconds under a load of 60 MPa to 80 MPa, e.g., under conditions of 140° C. to 160° C. for 4 to 6 seconds for a load of 65 MPa to 75 MPa.

In an implementation, the anisotropic conductive film may have an connection resistance of 4Ω or less, as measured after the anisotropic conductive film may be placed a glass comprising a first electrode and COF, Driver-IC or IC chip comprising a second electrode, followed by primary compression under conditions of 110° C. to 190° C. for 1 to 7 seconds under a load of 50 MPa to 90 MPa. In an implementation, the anisotropic conductive film may have a connection resistance of 3Ω or less, e.g., 2 Ω or less.

Within this range of the connection resistance, the anisotropic conductive film may help prevent signal interference of fine pitch electrodes.

In an implementation, the connection resistance of the anisotropic conductive film may be measured, e.g., by the following method: the anisotropic conductive film may be placed a glass comprising a first electrode and COF, Driver-IC or IC chip comprising a second electrode, followed by primary conditions of 150° C., 5 seconds, and 70 MPa to prepare 10 specimens for each condition. Then, connection resistance of each of the specimens is measured by a 4-probe measurement method, and an average value of the connection resistances is calculated.

In an implementation, the anisotropic conductive film according to the present embodiment may have a connection resistance after reliability testing of 10 Ω or less, as measured after the anisotropic conductive film may be placed a glass comprising a first electrode and COF, Driver-IC or IC chip comprising a second electrode, followed by the anisotropic conductive film is subjected to primary compression, and left at 85° C. and 85% RH for 500 hours. In an implementation, the anisotropic conductive film may have a connection resistance after reliability testing of 7Ω or less, e.g., 5 Ω or less or 3Ω or less.

Within this range, the anisotropic conductive film may maintain low connection resistance under high temperature and high humidity conditions, thereby improving connection reliability and may stably maintain the connection reliability, thereby increasing storage stability.

In addition, a semiconductor device connected by the anisotropic conductive film according to the present embodiment, which may have improved heat and moisture resistance, may be used for a long time under high temperature and high humidity conditions.

In an implementation, connection resistance of the anisotropic conductive film after reliability testing may be measured, e.g., by the following method. The anisotropic conductive film may be subjected to pre-compression and primary compression under measurement conditions of connection resistance, and left at 85° C. and 85% RH for 500 hours to perform high temperature/high humidity reliability testing. Then, connection resistance of each of the specimens may be measured and an average value of the connection resistances may be calculated.

Hereinafter, each of layers of an anisotropic conductive film according to an embodiment will be described in detail. Each of the layers of the anisotropic conductive film according to an embodiment may include a binder resin, an epoxy resin, and a curing agent. The conductive layer may further include inorganic particles and conductive particles.

The binder resin, the epoxy resin, and the curing agent included in the respective layers will be described in detail.

Binder Resin

In an implementation, a suitable binder resin may be used. Examples of the binder resin may include polyimide resins, polyamide resins, phenoxy resins, polymethacrylate resins, polyacrylate resins, polyurethane resins, modified polyurethane acrylate resins, polyester resins, polyester urethane resins, polyvinyl butylal resin, styrene-butylene-styrene (SBS) resins and epoxylated modifications thereof, styrene-ethylene-butylene-styrene (SEBS) resins and modifications thereof, acrylonitrile butadiene rubber (NBR) or hydrogenated compounds thereof. These may be used alone or in combination thereof.

For example, binder resins having different weight average molecular weights (Mw) and belonging to the same kind of binder resin may be used, and/or two or more kinds of binder resins having the same weight average molecular weight may be used.

For example, a phenoxy resin may be used as the binder resin. In an implementation, the phenoxy resin may include, e.g., a bisphenol-based first binder resin and/or a fluorene-based second binder resin.

In an implementation, in the first insulation layer, the binder resin may be present in an amount of 20% by weight (wt %) to 60 wt %, e.g., 30 wt % to 50 wt %, based on the total weight of the first insulation layer in terms of solid content.

In an implementation, in the conductive layer, the binder resin may be present in an amount of 20 wt % to 50 wt %, e.g., 20 wt % to 40 wt %, based on the total weight of the conductive layer in terms of solid content.

In an implementation, in the second insulation layer, the binder resin may be present in an amount of 15 wt % to 50 wt %, e.g., 20 wt % to 50 wt %, based on the total weight of the second insulation layer in terms of solid content.

For example, in the second insulation layer, the first binder may be present in an amount of 1 wt % to 20 wt % and the second binder may be present in an amount of 1 wt % to 30 wt %, based on the total weight of the second insulation layer in terms of solid content.

Within these ranges of the binder resin, the corresponding layers may have improved flowability and may exhibit suitable adhesive strength for the anisotropic conductive film.

Epoxy Resin

The epoxy resin may include at least one of epoxy monomers selected from bisphenol type, novolac type, glycidyl type, aliphatic and alicyclic epoxy monomers, epoxy oligomers thereof, and epoxy polymers thereof. In an implementation, the epoxy resin may include, e.g., a suitable material that includes at least one coupling structure selected from bisphenol type, novolac type, glycidyl type, aliphatic and alicyclic epoxy molecules.

One epoxy resin having a solid phase at room temperature and another epoxy resin having a liquid phase at room temperature may be used together. In addition, a flexible epoxy resin may also be used together with any of the above-described epoxy resins. Examples of the epoxy resin having a solid phase at room temperature may include, e.g., phenol novolac type epoxy resins, cresol novolac type epoxy resins, dicyclopentadiene-containing epoxy resins, and bisphenol A or F type polymer or modified epoxy resins.

Examples of the epoxy resin having a liquid phase at room temperature may include, e.g., bisphenol A or F type epoxy resins, or combinations thereof.

Examples of the flexible epoxy resin may include, e.g., dimer acid-modified epoxy resins, propylene glycol-containing epoxy resins, urethane-modified epoxy resins, and the like.

In an implementation, the aromatic epoxy resin may be selected from, e.g., naphthalene, anthracene, or pyrene resins.

Further, the epoxy resin used in the anisotropic conductive film according to the present embodiment may include a first epoxy resin that is not substituted with a hydroxyl group and a second epoxy resin that is substituted with a hydroxyl group.

In an implementation, the second epoxy resin substituted with a hydroxyl group may include, e.g., a hydrogenated bisphenol A type epoxy monomer represented by Formula 1 or a hydrogenated bisphenol A type epoxy oligomer represented by Formula 2, below.

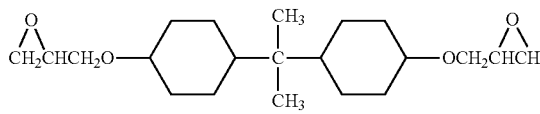

[Formula 1]

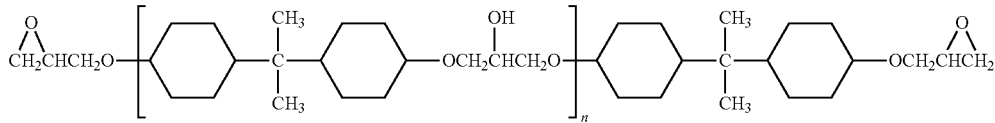

[Formula 2]

For example, in Formula 2, n may be an integer of 1 to 50.

In the first insulation layer, the epoxy resin may be present in an amount of 40 wt % to 80 wt %, e.g., 40 wt % to 70 wt %, based on the total weight of the first insulation layer in terms of solid content.

For example, the first epoxy resin may be present in an amount of 1 wt % to 30 wt %, and the second epoxy resin may be present in an amount of 10 wt % to 50 wt %, based on the total weight of the first insulation layer in terms of solid content. In an implementation, the first epoxy resin may be present in an amount of 10 wt % to 30 wt %, and the second epoxy resin may be present in an amount of 10 wt % to 40 wt %, based on the total weight of the first insulation layer in terms of solid content.

In an implementation, in the conductive layer, the epoxy resin may be present in an amount of 5 wt % to 20 wt %, e.g., 10 wt % to 20 wt %, based on the total weight of the conductive layer in terms of solid content.

In an implementation, the first epoxy resin may be present in an amount of 1 wt % to 20 wt %, and the second epoxy resin may be present in an amount of 1 to 30 wt %, based on the total weight of the conductive layer in terms of solid content. For example, the first epoxy resin may be present in an amount of 1 wt % to 10 wt %, and the second epoxy resin may be present in an amount of 1 wt % to 20 wt %, based on the total weight of the conductive layer in terms of solid content.

In an implementation, in the second insulation layer, the epoxy resin may be present in an amount of 40 wt % to 75 wt %, e.g., 40 wt % to 70 wt %, based on the total weight of the second insulation layer in terms of solid content.

For example, the first epoxy resin may be present in an amount of 1 wt % to 40 wt %, and the second epoxy resin may be present in an amount of 20 wt % to 60 wt %, based on the total weight of the second insulation layer in terms of solid content. In an implementation, the first epoxy resin may be present in an amount of 10 wt % to 40 wt %, and the second epoxy resin may be present in an amount of 30 wt % to 60 wt %, based on the total weight of the second insulation layer in terms of solid content.

Within these ranges of the epoxy resin in the respective layers, the anisotropic conductive film may exhibit sufficient adhesive strength with respect to glass, and may help reduce generation of short circuit by insulating properties resulting from the inherent molecular structure of the epoxy resin, thereby enhancing connection reliability of a semiconductor device.

In the second insulation layer of the anisotropic conductive film according to the present embodiment, the binder resin and the epoxy resin may be contained in a weight ratio of 1:1 to 1:8, e.g., 1:1 to 1:6 or 1:1 to 1:4.

Within this range, the anisotropic conductive film may compensate for limitation in filling with a single insulation layer and may help improve insulation reliability while securing excellent film formation and adhesive strength.

Curing Agent

A suitable curing agent that capable of curing epoxy resins may be used. Examples of the curing agent may include, e.g., acid anhydride curing agents, amine curing agents, imidazole curing agents, isocyanate curing agents, amide curing agents, hydrazide curing agents, phenol curing agents, cationic curing agents, and the like. These may be used alone or in combination thereof.

In an implementation, the curing agent may include a cationic curing agent, e.g., ammonium/antimony hexafluoride.

The curing agent may be used or provided as a mixture with the epoxy resin at room temperature, the curing agent may exhibit no reactivity with the epoxy resin at room temperature, and the curing agent may have activity at a predetermined temperature or higher, in order to exhibit properties of the curing agent through active reaction with the epoxy resin.

A suitable cationic curing agent that is capable of generating cationic ions with thermal activation energy may be used. For example, a cationic latent curing agent may be used.

Examples of the cationic latent curing agent may include, e.g., onium salt compounds, such as aromatic diazonium salts, aromatic sulfonium salts, aliphatic sulfonium salts, aromatic iodine aluminum salts, phosphonium salts, pyridinium salts, selenium salts, and the like; compound complexes, such as metal arene complexes, silanol/aluminum complexes, and the like; compounds containing a tosylate group such as benzoin tosylates, o-nitrobenzyl tosylates, and the like to provide a function of capturing electrons; and the like.

For example, sulfonium salt compounds having high efficiency in generation of cationic ions, such as aromatic sulfonium salt compounds or aliphatic sulfonium salt compounds may be used.

In an implementation, when such a cationic latent curing agent forms a salt structure, hexafluoroantimonate, hexafluorophosphate, tetrafluoroborate, pentafluorophenyl borate, and the like, may be used as counter ions in formation of a reactive side salt.

In the first insulation layer, the curing agent may be present in an amount of 0.1 wt % to 10 wt %, e.g., 1 wt % to 10 wt %, based on the total weight of the first insulation layer in terms of solid content.

In an implementation, in the conductive layer, the curing agent may be present in an amount of 0.5 wt % to 10 wt %, e.g., 1 wt % to 10 wt %, based on the total weight of the conductive layer in terms of solid content.

In an implementation, in the second insulation layer, the curing agent may be present in an amount of 0.5 wt % to 10 wt %, e.g., 1 wt % to 10 wt %, based on the total weight of the second insulation layer in terms of solid content.

Within this range, the curing agent may facilitate sufficient formation of an epoxy cured structure in the overall cured product, may help prevent excessive increase in hardness of the cured product to prevent deterioration in interface peeling force and adhesive strength, and may help prevent deterioration in stability and reliability due to the curing agent.

In an implementation, the conductive layer may further include inorganic particles and conductive particles.

Inorganic Particles

In an implementation, the conductive layer may include inorganic particles in order to help adjust flowability of the conductive layer. Examples of the inorganic particles may include, e.g., silica ($SiO_2$), $Al_2O_3$, $TiO_2$, ZnO, MgO, $ZrO_2$, PbO, $Bi_2O_3$, $MoO_3$, $V_2O_5$, $Nb_2O_5$, $Ta_2O_5$, $WO_3$, $In_2O_3$, and the like.

For example, silica may be used as the inorganic particles. The silica may include silica prepared by a liquid phase process such as sol-gel processing, sedimentation, and the like; silica prepared by a vapor phase process such as flame oxidation and the like; non-powdery silica obtained from silica gel without pulverization; fumed silica; fused silica; and the like. The silica particles may have, e.g., a spherical shape, a flake shape, an edgeless shape, and the like. These may be used alone or in combination thereof.

In an implementation, the conductive layer may include hydrophobic nano-silica particles subjected to surface treatment with an organic silane to allow efficient adjustment of flowability according to process conditions and to prevent expansion at high temperature by forming a very firm cured structure of the cured anisotropic conductive film, whereby the anisotropic conductive film may exhibit excellent adhesive strength and low connection resistance.

Examples of the hydrophobic silica nanoparticles subjected to surface treatment with the organic silane may include, e.g., Aerosil R-972, Aerosil R-202, Aerosil R-805, Aerosil R-812, Aerosil R-8200 (Degussa GmbH), and the like. In an implementation, any suitable nano-silica particles may be used.

In an implementation, the conductive layer may include silica. In an implementation, the silica may be present in an amount of 10 wt % to 40 wt %, e.g., 15 wt % to 40 wt %, based on the total weight of the conductive layer in terms of solid content.

If the silica particles were to have a larger particle size (average particle size) than the conductive particles, electrical conductivity may be reduced. For example, according to an embodiment, the average particle size of the silica particles included in each layer may be ¹/₂₀th to ⅕th the average particle size of the conductive particles. In an implementation, the silica particles included in the conductive layer may have an average particle size of 5 nm to 20 nm.

When the conductive layer includes the silica particles within these ranges of content and average particle size, the anisotropic conductive film may exhibit improved connection reliability and pre-compression performance through adjustment of the respective layers, and may help prevent short-circuit between the terminals while improving reliability after compression by reducing flowability of the conductive layer.

Conductive Particles

According to an embodiment, the conductive particles may be provided to the conductive layer to help improve electrical conductivity between the terminals, and suitable conductive particles may be used.

Examples of the conductive particles may include, e.g., metal particles such as gold (Au), silver (Ag), nickel (Ni), copper (Cu), and solder particles; carbon particles; resin particles, such as polyethylene, polypropylene, polyester, polystyrene, polyvinyl alcohol and modified resin particles thereof coated with metals, such as gold (Au), silver (Ag), nickel (Ni), and the like; and insulated conductive particles obtained by further coating insulating particles on the metal-coated polymer resin particles. These may be used alone or in combination thereof.

The average particle size of the conductive particles may be, e.g., 1 μm to 20 μm, depending upon the pitch of circuits to be used and upon the purpose thereof. In an implementation, the conductive particles may have an average particle size of, e.g., 1 μm to 10 μm.

In an implementation, the conductive particles may be present in an amount of 10 wt % to 40 wt %, e.g., 15 wt % to 40 wt %, based on the total weight of the conductive layer in terms of solid content.

Within these ranges of average particle size and content, the conductive particles can be easily compressed between the terminals to secure stable connection reliability and may help reduce connection resistance by improving electrical conductivity.

In an implementation, the conductive layer, the first insulation layer and the second insulation layer may further include other additives in order to impart additional properties to the anisotropic conductive film without deteriorating fundamental properties thereof.

Other Additives

The anisotropic conductive film may further include additives, e.g., polymerization inhibitors, tackifiers, antioxidants, heat stabilizers, curing accelerators, coupling agents, and the like. The amounts of these additives may be determined in various ways depending upon the purpose and desired effects of the film.

A method of preparing the anisotropic conductive film according to the embodiments may include a suitable method.

No special apparatus or equipment is required to form the anisotropic conductive film. For example, the anisotropic conductive film may be prepared by dissolving a binder resin in an organic solvent, adding other components to the binder resin, stirring the components for a predetermined period of time, applying the mixture to a suitable thickness of, e.g., 10 μm to 50 μm, onto a release film, and drying the mixture for a sufficient time to volatilize the organic solvent, thereby providing an anisotropic conductive film having a monolayer structure.

In an implementation, a suitable organic solvent may be used. In this embodiment, the aforementioned procedure may be repeated twice or more, thereby providing an anisotropic conductive film having a multilayer structure.

A suitable method may be used to form a semiconductor device connected by an anisotropic conductive film according to the embodiments.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Examples and Comparative Examples

A first insulation layer, a conductive layer, and a second insulation layer were prepared as listed in Table 1, below. The components in each layer are represented in units of wt %.

TABLE 1

| | | | Example | | | Comparative Example | | |
|---|---|---|---|---|---|---|---|---|
| Thickness and content (wt %) | | | 1 | 2 | 3 | 1 | 2 | 3 |
| First insulation layer | Binder resin | First binder | — | — | — | — | — | — |
| | | Second binder | 40 | 40 | 40 | 40 | 40 | 40 |
| | Epoxy resin | First epoxy | 23 | 23 | 23 | 23 | 23 | 23 |
| | | Second epoxy | 35 | 35 | 35 | 35 | 35 | 35 |
| | Curing agent | Cationic curing agent | 2 | 2 | 2 | 2 | 2 | 2 |
| | | Thickness (μm) | 1.0 | 1.0 | 1.0 | 1.0 | 1.0 | 1.0 |
| Conductive layer | Binder resin | First binder | — | — | — | — | 25 | — |
| | | Second binder | 25 | 25 | 25 | 55 | — | 15 |
| | Epoxy resin | First epoxy | 5 | 5 | 5 | 5 | 5 | 3 |
| | | Second epoxy | 8 | 8 | 8 | 8 | 8 | 5 |
| | Conductive particles | | 30 | 30 | 30 | 30 | 30 | 30 |
| | Curing agent | Cationic curing agent | 2 | 2 | 2 | 2 | 2 | 2 |
| | Inorganic particles | Silica nanoparticles | 30 | 30 | 30 | — | 30 | 45 |
| | | Thickness (μm) | 4.0 | 4.0 | 4.0 | 4.0 | 4.0 | 4.0 |

TABLE 1-continued

| Thickness and content (wt %) | | | Example | | | Comparative Example | | |
|---|---|---|---|---|---|---|---|---|
| | | | 1 | 2 | 3 | 1 | 2 | 3 |
| Second insulation layer | Binder resin | First binder | 10 | 8 | 6 | 10 | 5 | 10 |
| | | Second binder | 25 | 22 | 18 | 25 | 30 | 25 |
| | Epoxy resin | First epoxy | 15 | 20 | 25 | 15 | 15 | 15 |
| | | Second epoxy | 45 | 45 | 45 | 45 | 45 | 45 |
| | Curing agent | Cationic curing agent | 5 | 5 | 6 | 5 | 5 | 5 |
| | | Thickness (μm) | 12 | 12 | 12 | 12 | 12 | 12 |

First binder resin: Bisphenol A phenoxy resin (Union Carbide Corporation, Product name: PKHH, Weight average molecular weight: 50,000)

Second binder resin: Fluorene-based phenoxy resin (Osaka Gas Co., Ltd., Product name: EG200)

First epoxy resin (Mitsubishi Co., Ltd., Product name: JER-8404)

Second epoxy resin: Hydroxyl group-substituted epoxy resin (Formula 1)

Curing agent: Cationic curing agent (Samshin Chemical Co., Ltd., Product name: SI-60L)

Inorganic particles: 7 nm silica (Degussa GmbH, Product name: R812)

Conductive particles: 3 μm conductive particles (Sekisui Chemical Co., Ltd., Product name: AUL704)

Example 1

Preparation of First Insulation Layer Composition 40 wt % of the second binder resin (Osaka Gas Corporation, Product name: EG200), 23 wt % of the first epoxy resin (Mitsubishi Co., Ltd, Product name: JER-8404), and 35 wt % of the second epoxy resin (Formula 1) were mixed and stirred for 5 minutes using a C-mixer. Then, 2 wt % of the cationic curing agent (Samshin Chemical Co., Ltd., Product name: SI-60L) was added to the mixture, followed by stirring for 1 minute using the C-mixer (such that the temperature of the mixture did not exceed 60° C.), thereby forming a first insulation layer composition.

Preparation of Conductive Layer Composition

A conductive layer composition was prepared in the same manner as in the preparation of the first insulation layer composition except that the amounts of the binder resin, the epoxy resin and the curing agent were adjusted as shown in Table 1, and 3 μm conductive particles (AUL704, Sekisui Chemical Co., Ltd.) and 7 nm silica particles (R812, Degussa GmbH) were added.

Preparation of Second Insulation Layer Composition

A second insulation layer composition was prepared in the same manner as in the preparation of the first insulation layer composition except that the amounts of the binder resin, the epoxy resin and the curing agent were adjusted as shown in Table 1.

Preparation of Anisotropic Conductive Film

The first insulation layer was coated onto one surface of a polyethylene terephthalate release film and dried with hot air at 70° C. for 5 minutes to form a first insulation layer on a 1.0 μm thick base film.

Then, a 4 μm thick conductive layer was formed on the first insulation layer using the conductive layer composition, and a 12 μm thick second insulation layer was formed on the conductive layer using the second insulation layer composition, thereby preparing an anisotropic conductive film.

Example 2

An anisotropic conductive film was prepared in the same manner as in Example 1 by adjusting the amounts of the respective components in the second insulation layer as listed in Table 1.

Example 3

An anisotropic conductive film was prepared in the same manner as in Example 1 by adjusting the amounts of the respective components in the second insulation layer as listed in Table 1.

Comparative Example 1

An anisotropic conductive film was prepared in the same manner as in Example 1 by adjusting the amounts of the respective components as listed in Table 1, e.g., the conductive layer composition did not include the inorganic particles and the second binder resin was used in an amount of 55 wt %.

Comparative Example 2

An anisotropic conductive film was prepared in the same manner as in Example 1 by adjusting the amounts of the respective components as listed in Table 1, e.g., the conductive layer was prepared using the first binder resin instead of the second binder resin.

Comparative Example 3

An anisotropic conductive film was prepared in the same manner as in Example 1 by adjusting the amounts of the respective components as listed in Table 1, e.g., the conductive layer included 15 wt % of the second binder resin, 3 wt % of the first epoxy resin, 5 wt % of the second epoxy resin, and 45 wt % of silica.

Experimental Example 1

Measurement of Increased Ratio of Expansion Length

The increased ratio of expansion length of each layer of the anisotropic conductive films prepared in the Examples and Comparative Examples was measured as follows.

A sample having a size of 2 mm×20 mm (width×length) was prepared. Then, glass substrates were placed on upper and lower sides of the anisotropic conductive film respectively, followed by compression at 150° C. (with reference to detection temperature of an anisotropic conductive film) for 5 seconds under a load of 3 MPa (per unit area of the sample).

The length of each layer in the width direction thereof was measured before compression and after compression. The increased length of the corresponding layer, e.g., the expansion length, may be expressed by the increased ratio of expansion rate according to Equation 1.

Increased ratio of expansion length (%)=[(length of corresponding layer in width direction after compression−length of corresponding layer in width direction before compression)/length of corresponding layer in width direction before compression]×100   [Equation 1]

Experimental Example 2

Measurement of Expansion Length Ratio of Second Insulation Layer/Conductive Layer The ratio of expansion length of the second insulation layer to the expansion length of the conductive layer of each of the anisotropic conductive films prepared in the Examples and Comparative Examples was measured as follows.

A sample having a size of 2 mm×20 mm (width×length) was prepared. Then, glass substrates were placed on upper and lower sides of the anisotropic conductive film respectively, followed by compression at 150° C. (with reference to detection temperature of an anisotropic conductive film) for 5 seconds under a load of 3 MPa (per unit area of the sample).

Then, a widthwise length of each layer was measured after compression under this condition to calculate the ratio of the expansion length of the second insulation layer to the expansion length of the conductive layer.

Experimental Example 3

Measurement of Particle Capture Rate

The particle capture rate of each of the anisotropic conductive films prepared in the Examples and Comparative Examples was measured as follows.

The anisotropic conductive films were prepared by placing between COF (Samsung Electronics Co., Ltd.) and a glass plate coated with a 1,000 Å thick ITO layer.

The number of conductive particles (e.g., the number of particles before compression) placed on terminals before pre-compression and the number of conductive particles (e.g., the number of particles after compression) placed on the terminals after primary compression were measured using a metallurgical microscope, followed by calculating the particle capture rate according to Equation 2.

Particle capture rate=(the number of conductive particles per unit area (mm²) of connected portion after primary compression/the number of conductive particles per unit area (mm²) of anisotropic conductive film before pre-compression)×100   [Equation 2]

Pre-compression and primary compression were performed under the following conditions.
1) Pre-compression: 70° C., 1 second, 1 MPa
2) Primary compression: 150° C., 5 second, 70 MPa

Experimental Example 4

Measurement of Connection Resistance and Connection Reliability after Reliability Testing Connection resistance and connection reliability after reliability testing of each of the anisotropic conductive films prepared in the Example and Comparative Example were measured as follows.

Each of the anisotropic conductive films was left at room or ambient temperature (~25° C.) for 1 hour, and 10 specimens of each anisotropic conductive film were prepared by connecting the anisotropic conductive film to COF (Samsung Electronics Co., Ltd.) prepared by forming a pattern, which allows 4-probe measurement, on a 0.5 t pattern-free glass plate coated with a 1,000 Å thick ITO layer, through pre-compression under conditions of a measured temperature of 70° C., 1 second and 1 MPa and primary compression under conditions of 150° C., 5 seconds and 70 MPa. Connection resistance of each of the specimens was measured by a four-probe measurement method (in accordance with ASTM F43-64T), and an average of the connection resistances was calculated.

Then, after the 10 specimens of each anisotropic conductive film were left at 85° C. and 85% RH for 500 hours to evaluate reliability under high temperature and high humidity conditions, connection resistance of each of the specimens was measured (in accordance with ASTM D117), and an average value was calculated.

Measurement results of Experimental Examples 1 to 4 are shown in Table 2, below.

TABLE 2

|  | Expansion length (%) | | Expansion length ratio of second insulation layer/conductive layer | Particle capture rate (%) | Connection resistance (Ω) | Reliability Connection resistance (Ω) |
| --- | --- | --- | --- | --- | --- | --- |
|  | Second insulation layer | Conductive layer | | | | |
| Example 1 | 130 | 10 | 13 | 58 | 0.44 | 1.32 |
| Example 2 | 155 | 16 | 9.7 | 52 | 0.46 | 1.41 |
| Example 3 | 160 | 18 | 8.9 | 50 | 0.43 | 1.25 |
| Comparative Example 1 | 180 | 40 | 4.5 | 15 | 0.45 | 10 |
| Comparative Example 2 | 45 | 45 | 1 | 23 | 0.87 | 25 |
| Comparative Example 3 | 120 | 5 | 24 | 48 | 4.5 | 1,000 |

Referring to Table 2, in the anisotropic conductive films prepared in Examples 1 to 3, the conductive layers had an increased ratio of expansion length of 20% or less, the second insulation layers had an increased ratio of expansion length of 50% or more, and the expansion length ratio of second insulation layer/conductive layer ranged from 3 to 50.

Within these ranges of the measurement values, it may be seen that the flowability of the conductive layer and the second insulation layer was suitably adjusted to provide further improved particle capture rate, and connection resistance and post-reliability testing connection resistance, whereby the anisotropic conductive films had improved insulating properties and electrical conductivity.

In Comparative Example 1, the flowability of the conductive layer was adjusted only by the binder resin without adding silica. In this case, it may be seen that, although the conductive layer had improved flowability, the conductive layer had a particle capture rate of less than 30%, thereby requiring increase in amount of conductive particles in order to secure desired electrical conductivity, making it difficult to reduce outflow of the conductive particles into a space, and providing a post-reliability testing connection resistance of greater than 10 Ω.

In addition, in Comparative Example 2, the conductive layer was prepared using the first binder resin without using the second binder resin. In this case, it may be seen that, although the conductive layer had improved flowability, the conductive layer had high connection resistance and poor connection resistance after reliability testing. Further, in Comparative Example 3, it may be seen that, although an excess of silica included in the conductive layer may secure the particle capture rate by suppressing flowability, the anisotropic conductive film may not have improved connection resistance and connection resistance after reliability testing.

By way of summation and review, in order to satisfy recent tendency of fine pitch and reduction in bump area of an integrated circuit (IC), a decrease in average particle size of conductive particles in an anisotropic conductive film or an increase in amount of the conductive particles to improve conductivity may be considered. However, decrease in average particle size of the conductive particles may cause uneven connection or short circuit between patterns due to secondary agglomeration of the conductive particles, and an increase in amount of the conductive particles may cause short circuit between the patterns.

Accordingly, outflow of conductive particles into a space may be suppressed by coating the surfaces of the conductive particles with an insulation layer or by forming the anisotropic conductive film in plural layers, low capture rate of the conductive particles on bumps due to low difference in melt viscosity between the respective layers may occur. In addition, when the conductive layer is formed to have very low flowability in order to help prevent increase in connection resistance and short circuit due to outflow of the conductive particles, deterioration in pre-compression processibility due to reduction in adhesion to a substrate may occur.

The embodiments may provide a semiconductor device connected by an anisotropic conductive film, which exhibits suitable insulating properties and conductivity and has improved connection reliability.

The embodiments may provide a semiconductor device connected by an anisotropic conductive film, which may help secure suitable insulating properties and electrical conductivity and has improved connection reliability by adjusting flowability of a conductive layer and an insulation layer to enhance a capture rate of conductive particles.

The embodiments may provide a semiconductor device that is connected by an anisotropic conductive film having improved properties in terms of insulation, conductivity and connection reliability, and can be used for a long time under high temperature and high humidity conditions.

According to an embodiment, the anisotropic conductive film included in the semiconductor device may exhibit suitable insulating properties and conductivity, thereby improving connection reliability after curing.

The embodiments may provide a semiconductor device connected by an anisotropic conductive film, which may help secure suitable insulating properties and conductivity and has improved connection reliability by adjusting flowability of the conductive layer and the insulation layer to enhance a capture rate of conductive particles based on low flowability of the conductive layer without increasing the amount of conductive particles.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

LIST OF REFERENCE NUMERALS

1: first insulation layer
2: conductive layer
3: second insulation layer
10: anisotropic conductive film
40: conductive particles
50: first connecting member
60: second connecting member
70: first electrode
80: second electrode

What is claimed is:
1. A device comprising:
a glass substrate that includes a first electrode;
a chip on film (COF), Driver Integrated Circuit (Driver-IC), or Integrated Circuit (IC) chip that includes a second electrode; and
an anisotropic conductive film, wherein the anisotropic conductive film is between the glass substrate that includes the first electrode and the COF, Driver-IC, or IC chip that includes the second electrode, the anisotropic conductive film comprising:
a first insulation layer, a conductive layer, and a second insulation layer sequentially stacked one above another, wherein:
the conductive layer has an increased ratio of expansion length of 20% or less in a width direction thereof, and
the second insulation layer has an increased ratio of expansion length of 50% or more in a width direction thereof,
the increased ratio of expansion length is calculated according to Equation 1, below, after glass substrates are placed on upper and lower sides of the anisotropic conductive film respectively, followed by compression at 110° C. to 200° C. for 3 to 7 seconds under a load of 1 MPa to 7 MPa per unit area of a sample,

$$\text{Increased ratio of expansion length (\%)} = [(\text{length of layer in width direction after compression} - \text{length of layer in width direction before compression}) / \text{length of layer in width direction before compression}] \times 100, \quad [\text{Equation 1}]$$

a ratio of the expansion length of the second insulation layer to the expansion length of the conductive layer ranges from 4 to 20, and the anisotropic conductive film has an connection resistance of 4Ω or less, and has a particle capture rate of 30% to 60%, as measured after the anisotropic conductive film is between a glass that includes a first electrode and a COF, Driver-IC, or IC chip that includes a second electrode, followed by primary compression under conditions of 110° C. to 190° C. for 1 to 7 seconds under a load of 50 MPa to 90 MPa, and calculated by Equation 2:

Particle capture rate=(the number of conductive particles per unit area (mm2) of connected portion after primary compression/the number of conductive particles per unit area (mm2) of anisotropic conductive film before pre-compression)×100. [Equation 2]

2. The device as claimed in claim 1, wherein the anisotropic conductive film has a connection resistance after reliability testing of 10Ω or less, as measured after the anisotropic conductive film is placed a glass comprising a first electrode and COF, Driver-IC or IC chip comprising a second electrode, followed by primary compression under conditions of 110° C. to 190° C. for 1 to 7 seconds under a load of 50 MPa to 90 MPa, and left at 85° C. and 85% RH for 500 hours.

3. The device as claimed in claim 1, wherein:
the first insulation layer has a thickness of 2 μm or less,
the conductive layer has a thickness of 2 μm to 10 μm, and
the second insulation layer has a thickness of 6 μm to 18 μm.

4. The device as claimed in claim 1, wherein the conductive layer includes 10 wt % to 40 wt % of inorganic particles, based on a total weight of the conductive layer in terms of solid content.

5. The device as claimed in claim 4, wherein the inorganic particles have an average particle size of 5 nm to 20 nm.

6. The device as claimed in claim 1, wherein the conductive layer includes:
20 wt % to 50 wt % of a binder resin;
5 wt % to 20 wt % of an epoxy resin;
0.5 wt % to 10 wt % of a curing agent;
10 wt % to 40 wt % of inorganic particles; and
10 wt % to 40 wt % of conductive particles, all wt % being based on a total weight of the conductive layer in terms of solid content.

7. The device as claimed in claim 3, wherein the second insulation layer includes a binder resin and an epoxy resin in a weight ratio of 1:1 to 1:8.

8. The device as claimed in claim 7, wherein the second insulation layer includes:
15 wt % to 50 wt % of a binder resin; and
40 wt % to 75 wt % of an epoxy resin, all wt % being based on a total weight of the second insulation layer in terms of solid content.

9. The device as claimed in claim 3, wherein the first insulation layer includes:
20 wt % to 60 wt % of a binder resin;
40 wt % to 80 wt % of an epoxy resin; and
0.1 wt % to 10 wt % of a curing agent, all wt % being based on a total weight of the first insulation layer in terms of solid content.

* * * * *